United States Patent
Muthiah et al.

(10) Patent No.: US 11,249,135 B2
(45) Date of Patent: Feb. 15, 2022

(54) SYSTEM AND METHOD FOR PROVIDING AN INFERENCE ASSOCIATED WITH DELAYS IN PROCESSING INPUT DATA PACKET(S)

(71) Applicant: HCL Technologies Limited, Noida (IN)

(72) Inventors: Manickam Muthiah, Chennai (IN); Sathish Kumar Krishnamoorthy, Chennai (IN)

(73) Assignee: HCL Technologies Limited, New Delhi (IN)

(*) Notice: Subject to any disclaimer, the term of this patent is extended or adjusted under 35 U.S.C. 154(b) by 0 days.

(21) Appl. No.: 17/036,296

(22) Filed: Sep. 29, 2020

(65) Prior Publication Data
US 2021/0116502 A1    Apr. 22, 2021

(30) Foreign Application Priority Data
Oct. 22, 2019  (IN) .............. 201911042914

(51) Int. Cl.
*G06F 30/3308*    (2020.01)
*G01R 31/3183*    (2006.01)
*G01R 31/317*    (2006.01)
*G06N 5/04*    (2006.01)

(52) U.S. Cl.
CPC ......... *G01R 31/318328* (2013.01); *G01R 31/31704* (2013.01); *G01R 31/31725* (2013.01); *G06N 5/04* (2013.01)

(58) Field of Classification Search
CPC ...... G01R 31/318328; G01R 31/31704; G01R 31/31725; G06N 5/04; G06N 5/006; G06F 30/3308
See application file for complete search history.

(56) References Cited

U.S. PATENT DOCUMENTS

2018/0189425 A1* 7/2018 Van Vaerenbergh ............ G06F 30/327

* cited by examiner

*Primary Examiner* — Nghia M Doan
(74) *Attorney, Agent, or Firm* — Kendal Sheets

(57) ABSTRACT

Disclosed is a system for providing an inference associated with delays in processing input data packet(s) by a Design Under Verification (DUV)/System Under Verification (SUV) characterized by maintaining timing information of the input data packet(s) is disclosed. To provide an inference, initially, an input data packet is processed by a DUV or SUV. Simultaneously, an expected data packet corresponding to the input data packet is predicted and a Unique Identifier is assigned to the expected data packet corresponding to the input data packet that entered into the DUV/SUV. After assigning the Unique Identifier, the plurality of data fields pertaining to the Unique Identifier are populated in an array of Packet Timing Entries based on a Delay Identifier (ID) and a Delay Mode. The plurality of data fields may then be used for reporting various delay statistics and operational behaviour of DUV/SUV.

15 Claims, 3 Drawing Sheets

SYSTEM AND METHOD FOR PROVIDING AN INFERENCE ASSOCIATED WITH DELAYS IN PROCESSING INPUT DATA PACKET(S)

CROSS-REFERENCE TO RELATED APPLICATIONS AND PRIORITY

The present application claims priority from Indian Patent Application No. 201911042914 filed on 22 Oct. 2019, the entity of which is hereby incorporated by reference.

TECHNICAL FIELD

The present disclosure in general relates to a field of hardware logic/electronic design/digital circuits verification. More particularly, the present invention relates to system and method for providing an inference associated with delays in processing input data packet(s) by a Design Under Verification (DUV) or System Under Verification (SUV).

BACKGROUND

Integrated Circuit Design (ICD) or Chip Design is a branch of electronics engineering. The ICD deals with encompassing the particular logic and circuit design techniques required for designing Integrated Circuits (ICs). Initially, the ICs contained only a few transistors. However, the number of transistors in the ICs has increased dramatically since then. The term "Large Scale Integration" (LSI) was first used to describe this theoretical concept, which further gave rise to the terms including, but not limited to, a "Small-Scale Integration" (SSI), a "Medium-Scale Integration" (MSI), a "Very-Large-Scale Integration" (VLSI), and an "Ultra-Large-Scale Integration" (ULSI). The development of the VLSI started with hundreds of thousands of transistors in the early 1980s, and has continued beyond ten billion transistors as of now.

Modern ICs are immensely complicated. The complexity of the modern IC design and market pressure for producing designs rapidly has led to the extensive use of automated design tools in process of IC designing. In short, the design of an IC using an Electronic Design Automation (EDA) is the process of design, verification and testing of the instructions that the IC has to carry out.

The EDA and an Electronic Computer-Aided Design (ECAD) is a category of tools that is used to design electronic systems such as integrated circuits as well as printed circuit boards. Designers use these tools that work together in a flow to design and analyze the entire semiconductor chips. The EDA tools are essential for designing modern semiconductor chips which have billions of components. The EDA tools help chip design with programming languages that compiled them to silicon. Due to immediate result, there was a considerable increase in the complexity of the chips that could be designed, with improved access to design verification tools that are based on Logic Simulation. A chip designed using this process is easier to layout and more likely to function correctly, since the design of the chip could be simulated more thoroughly prior to construction. Although the languages and tools have evolved, this general approach of specifying the desired behaviour in a textual programming language and letting the tools derive the detailed physical design has remained the basis of digital IC design even today.

A Simulation (or "sim") is an attempt to model a real-life or hypothetical situation on a computer to study the working of the system. Predictions may be made about the behaviour of a system, by changing variables in the simulation. It is a tool to virtually investigate the behaviour of the system understudy.

A logic simulation is the use of simulation software for predicting the behaviour of digital circuits and Hardware Description Languages (HDL). It simulates the logic before it is built. Simulations have the advantage of providing a familiar look and feel to the user in that it is constructed from the same language and symbols used in design. Simulation is a natural way for the designer to get feedback on their design, by allowing the user to interact directly with the design. Logic simulation may be used as a part of a Functional Verification process in designing hardware.

Functional verification is the process followed for verifying whether the logic design conforms to the design specification. In everyday terms, the functional verification asserts whether the proposed design do what is intended. This is a complex task, and takes the majority of time and effort in largest electronic system design projects.

The HDL, a specialized computer language, is used for describing the structure and behaviour of electronic circuits, and most commonly, digital logic circuits. The HDL enables a precise, formal description of an electronic circuit which allows for the automated analysis and simulation of an electronic circuit. The HDL is much like a programming language such as C Programming language. The HDL is a textual description language consisting of expressions, statements and control structures. One important difference between most programming languages and the HDLs is that the HDLs explicitly include the notion of time. The key advantage of the HDL, when used for systems design, is that the HDL allows the behaviour of the required system to be described (modelled) and verified (simulated) before synthesis tools translate the design into a real hardware (gates and wires). With time, VHSIC Hardware Description Language (VHDL) and Verilog emerged as the dominant HDLs in the electronics industry, while older and less capable HDLs gradually disappeared. Over the years, much effort has been invested in improving HDLs. The latest iteration of the Verilog, formally known as System Verilog, introduces many new features (classes, random variables, and properties/assertions) to address the growing need for better testbench randomization, design hierarchy, and reuse.

A testbench is an (often virtual) environment used to verify the correctness or soundness of a design or a model. In the context of firmware or hardware engineering, a testbench refers to an environment in which the design/system/product under development is verified with the aid of software and hardware tools. The suite of verification tools is designed specifically for the design/system/product under verification. The testbench, commonly referred as a verification environment (or just environment) contains a set of components including, but not limited to, bus functional models (BFMs), bus monitors, memory modules, and interconnect of such components with a Design Under Verification (DUV).

A simulation environment is typically composed of several types of components. A generator generates input vectors that are used to search for anomalies that exist between an intent (specifications) and implementation (HDL Code). Modern generators create directed-random and random stimuli that are statistically driven to verify random parts of the design. The randomness is important to achieve a high distribution over the huge space of the available input stimuli. To this end, users of these generators intentionally under-specify the requirements for the generated tests. It is the role of the generator to randomly fill this gap. This allows the generator to create inputs that reveal bugs not being searched by the user. The generators also bias the stimuli towards design corner cases to further stress the logic. Biasing and randomness serve different goals and there are trade-offs between them. As a result, different generators have a different mix of these characteristics. Since the input for the design must be valid (legal) and many targets (such as biasing) should be maintained, many generators use the Constraint Satisfaction Problem (CSP) technique to solve the complex verification requirements. The legality of the design inputs and the biasing arsenal are modelled. The model-based generators use this model to produce the correct stimuli for the target design.

Drivers translate the stimuli produced by the generator into the actual inputs for the design under verification. The generators create inputs at a high level of abstraction, as transactions and drivers convert this input into actual design inputs as defined in the specification of the design's interface.

A Monitor converts the state of the design and its outputs to a transaction abstraction level so it can be stored in a scoreboard's database to be checked later on.

A Scoreboard/Checker validates that the contents of the scoreboard are legal. There are cases where the generator creates expected results, in addition to the inputs. In these cases, the checker must validate that the actual results match the expected ones.

An Arbitration Manager is configured to manage all the above components together.

The simulator produces the outputs of the design, based on the design's current state (the state of the flip-flops) and the injected inputs. The simulator has a description of the design net-list. This description is created by synthesizing the HDL to a low gate level net-list.

Simulation based verification is widely used to "simulate" the design, since this method scales up very easily. Stimulus is targeted to exercise each line in the HDL code. The testbench is built to functionally verify the design by providing meaningful scenarios to check that given certain input, the design performs to the specification.

The level of effort required to debug and then verify whether the design is proportional to the maturity of the design. That is, early in the design's life, bugs and incorrect behaviour are usually found quickly. As the design matures, the simulation requires more time and resources to run, and errors will take progressively longer to be found.

One of the most critical tasks in developing a new hardware such as the IC chips, Field-Programmable Gate Arrays (FPGA), Application-Specific Integrated Circuits (ASIC), System On Chips (SOC) etc. is to verify them for different design/function/performance specifications. These specifications may be predefined by the customer of the chips or can be an industry standard too. Another challenge faced by the verification team of this hardware is to debug the failures (if any) that arises during the process of verification using the log file(s) and identify the root cause of the failure.

It has been observed that an input data packet(s) entering a Design/System Under Verification (DUV/SUV) might take different data paths, endure different delays etc. and make it to the DUV/SUV output via different interfaces at different times. Calculating the delays endured inside the DUV/SUV by the input data packet(s) that are destined for different DUV Output Paths/Interfaces becomes time-consuming as the complexity of the DUV/SUV increases. Moreover, identifying/calculating deviations of the actual DUV/SUV delays from the expected DUV delays for various data packet(s) becomes cumbersome without a standalone module.

SUMMARY

This summary is provided to introduce aspects related to systems and methods for providing an inference associated with the delays in processing input data packet(s) by a Design Under Verification (DUV)/System Under Verification (SUV) and the aspects are further described below in the detailed description. This summary is not intended to identify essential features of the claimed subject matter nor is it intended for use in determining or limiting the scope of the claimed subject matter.

In one implementation, a system for providing an inference associated with delays in processing input data packet(s) by a Design Under Verification (DUV)/System Under Verification (SUV) characterized by maintaining timing information of the input data packet(s) is disclosed. The system comprises a Design Under Verification or System Under Verification (DUV/SUV) and a testbench configured to communicate with the DUV/SUV. The DUV/SUV may be configured to process a set of input data packets to generate a set of actual data packets. The testbench may comprise a prediction unit and a Data Integrity Checker/Scoreboard. The prediction unit may be configured to predict an expected data packet corresponding to the input data packet and assign a unique identifier (Unique ID) to the expected data packet corresponding to the input data packet that entered into the DUV/SUV for processing. The prediction unit may further be configured to populate a plurality of data fields pertaining to the Unique ID in an array of data type Packet Timing Entries. In one aspect, the plurality of data fields may be populated by determining a Delay Identifier (Delay ID) and a Delay Mode for the expected data packet. The Delay ID may be determined based on at least one of a type of the expected data packet and a data path followed by the expected data packet within the DUV/SUV. The Delay Mode, on the other hand, may be determined based on the Delay ID. In one aspect, the Delay Mode may be determined as at least one of 'Mode 0' and 'Mode 1'. Post determination of the Delay ID and the Delay Mode, a first set of data fields and a second set of data fields may be populated. In one aspect, the first set of data fields may be populated based on the Delay ID. The second set of data fields may be populated based on the Delay Mode. The Data Integrity Checker/Scoreboard may be configured to compare the expected data packet with an actual data packet. In one aspect, the actual data packet indicates the input data packet after being processed by the DUV/SUV. Post comparison, the Data Integrity Checker/Scoreboard may assign a value of '1' to a DUV Output Packet Seen flag in the array of Packet Timing Entries corresponding to the Unique ID, when the expected data packet is matched with the actual data packet. In one aspect, the DUV Output Packet Seen flag's value '1' indicates that the actual data packet is out after being processed by the DUV/SUV. Subsequently, the Data Integrity Checker/Scoreboard may populate a third set of data fields when the DUV Output Packet Seen flag's value is assigned with '1', a fourth set of data fields, when the DUV Output Packet Seen flag's value is assigned with '1' and the Delay Mode is determined as 'Mode 0', and a fifth set of data fields, when the DUV Output Packet Seen flag's value is assigned with '1' and the Delay Mode is determined as 'Mode 1'. In one aspect, the first set, the second set, the third set, the fourth set and the fifth set are subsets of the plurality data fields.

Thus, in this manner, the system may provide the inference associated to the delays in processing the input data packet(s) based on one or more subsets, of the plurality data fields, and the Delay Mode.

In another implementation, a method for providing an inference associated with delays in processing input data packet(s) by a Design Under Verification (DUV)/System Under Verification (SUV) characterized by maintaining timing information of the input data packet is disclosed. In order to provide an inference, initially, an input data packet may be processed by a Design Under Verification (DUV) or System Under Verification (SUV). Simultaneously, an expected data packet corresponding to the input data packet may be predicted and a Unique Identifier (Unique ID) is assigned to the expected data packet corresponding to the input data packet that entered into the DUV/SUV for processing. After assigning the Unique ID, the plurality of data fields pertaining to the Unique ID may be populated in an array of data type Packet Timing Entries. In one aspect, the plurality of data fields may be populated by determining a Delay Identifier (Delay ID) and a Delay Mode for the expected data packet. The Delay ID may be determined based on at least one of a type of the expected data packet and a data path followed by the expected data packet within the DUV/SUV. The Delay Mode, on the other hand, may be determined based on the Delay ID, and wherein the Delay Mode is determined as at least one of 'Mode 0' and 'Mode 1'. After determining the Delay ID and Delay Mode, a first set of data fields and a second of data fields may be populated. In one aspect, the first set of data fields may be populated based on the Delay ID. The second set of data fields may be populated based on the Delay Mode. After populating the first set of data fields and the second set of data fields, the expected data packet may be compared with an actual data packet. In one aspect, the actual data packet indicates the input data packet after being processed by the DUV/SUV. If the expected data packet matches the actual data packet, a value of '1' may be assigned to a DUV Output Packet Seen flag in the array of Packet Timing Entries corresponding to the Unique ID. In one aspect, the DUV Output Packet Seen flag's value '1' indicates that the actual data packet is out after being processed by the DUV/SUV. Subsequently, a third set of data fields may be populated when the DUV Output Packet Seen flag's value is assigned with '1', a fourth set of data fields may be populated, when the DUV Output Packet Seen flag's value is assigned with '1' and the Delay Mode is determined as 'Mode 0', and a fifth set of data fields may be populated, when the DUV Output Packet Seen flag's value is assigned with '1' and the Delay Mode is determined as 'Mode 1'. The first set, the second set, the third set, the fourth set and the fifth set are subsets of the plurality data fields. Thus, in this manner, the inference associated to the delays in processing the input data packet(s) may be provided based on one or more subsets, of the plurality data fields, and the Delay Mode.

In yet another implementation, non-transitory computer readable medium embodying a program executable in a computing device for providing an inference associated with delays in processing data packet(s) by a Design Under Verification (DUV)/System Under Verification (SUV) characterized by maintaining timing information of the input data packet is disclosed. The program may comprise a program code for processing an input data packet by a Design Under Verification (DUV) or System Under Verification (SUV). The program may further comprise a program code for predicting an expected data packet corresponding to the input data packet and thereby assign a Unique Identifier (Unique ID) to the expected data packet corresponding to the input data packet that entered into the DUV/SUV for processing. The program may further comprise a program code for populating the plurality of data fields pertaining to the Unique ID in an array of data type Packet Timing Entries by determining a Delay Identifier (Delay ID) and a Delay Mode for the expected data packet, wherein the Delay ID is determined based on at least one of a type of the expected data packet and a data path followed by the expected data packet within the DUV/SUV, and wherein the Delay Mode is determined based on the Delay ID, and wherein the Delay Mode is determined as at least one of 'Mode 0' and 'Mode 1', and populating a first set of data fields and a second of data fields, wherein the first set of data fields is populated based on the Delay ID, and wherein the second set of data fields is populated based on the Delay Mode. The program may further comprise a program code for comparing the expected data packet with an actual data packet. In one aspect, the actual data packet indicates the input data packet after being processed by the DUV/SUV. The program may further comprise a program code for assigning a value of '1' to a DUV Output Packet Seen flag in the array of Packet Timing Entries corresponding to the Unique ID, when the expected data packet is matched with the actual data packet, wherein the DUV Output Packet Seen flag's value '1' indicates that the actual data packet is out after being processed by the DUV/SUV. The program may further comprise a program code for populating a third set of data fields when the DUV Output Packet Seen flag's value is assigned with '1', a fourth set of data fields, when the DUV Output Packet Seen flag's value is assigned with '1' and the Delay Mode is determined as 'Mode 0', and a fifth set of data fields, when the DUV Output Packet Seen flag's value is assigned with '1' and the Delay Mode is determined as 'Mode 1', wherein the first set, the second set, the third set, the fourth set and the fifth set are subsets of the plurality data fields thereby providing an inference associated to delays in processing the input data packet(s) based on one or more subsets, of the plurality data fields, and the Delay Mode.

BRIEF DESCRIPTION OF DRAWINGS

The foregoing detailed description of embodiments is better understood when read in conjunction with the appended drawings. For the purpose of illustrating the disclosure, example constructions of the disclosure are shown in the present document; however, the disclosure is not limited to the specific methods and systems disclosed in the document and the drawings.

The detailed description is described with reference to the accompanying figures. In the figures, the left-most digit(s) of a reference number identifies the figure in which the reference number first appears. The same numbers are used throughout the drawings to refer like features and components.

DETAILED DESCRIPTION

Figure 1:
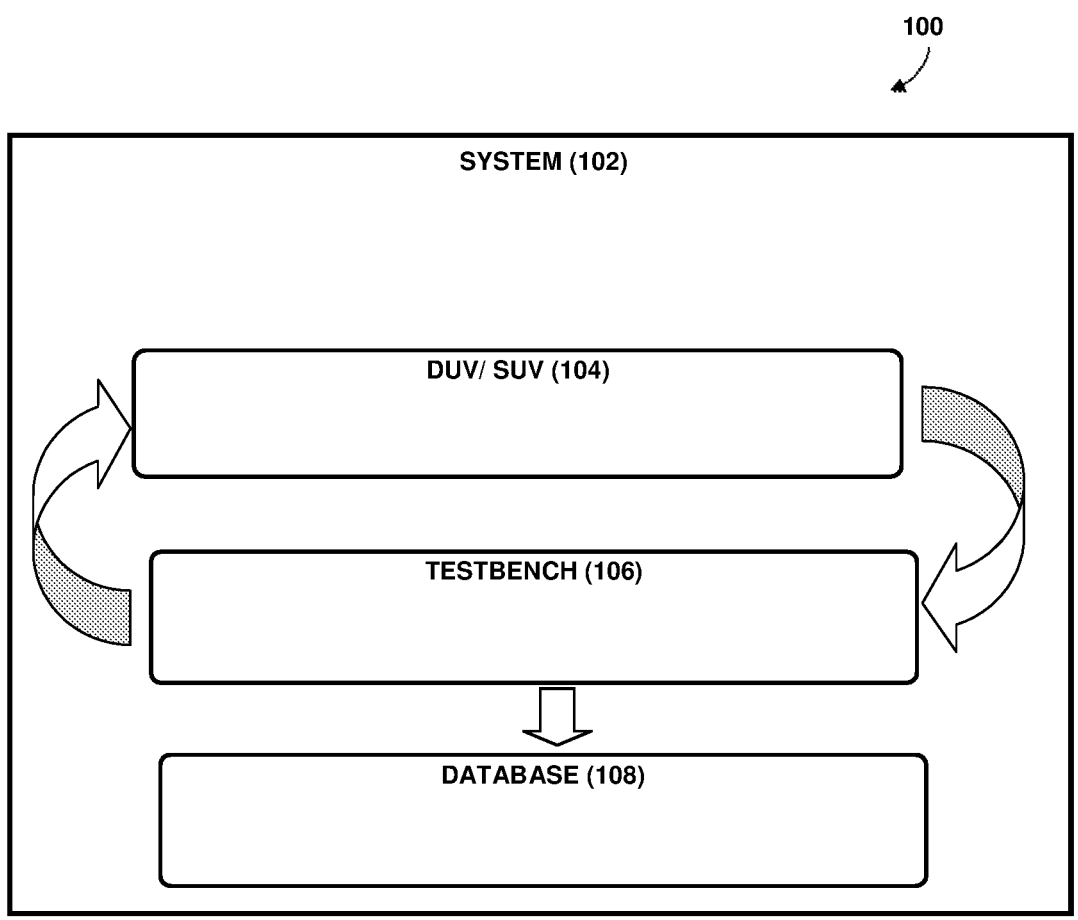
FIG. 1 illustrates an overview of a system for providing an inference associated with delays in processing input data packet(s) by a Design Under Verification (DUV)/System Under Verification (SUV), in accordance with an embodiment of the present subject matter.

The present system provides an inference associated with the delays in processing input data packet(s) by a Design Under Verification (DUV)/System Under Verification (SUV). The DUV/SUV may correspond to a design of an electronic circuit or a design of an integrated chip written in a Hardware Description Language (HDL) and is configured to process an input data packet. To inject the input data packet, the proposed invention comprises a testbench configured to communicate with the DUV/SUV. It may be noted that while processing, the input data packet may either get lost inside the DUV/SUV or may come out of the DUV/SUV as an actual data packet after a significant amount of delay.

In order to analyse the delay behavior of the DUV/SUV, the proposed invention system uses a standalone module that acts as a Packet Timekeeper. The Packet Timekeeper, as the name suggests, stores timing information pertaining to an input data packet processed inside the DUV/SUV and thereby reports delay specification violations. In one aspect, the delay specification violations include various reports indicating delay, delay variance and output rate that may be useful for analysing the DUV/SUV delay behaviour. The Packet Timekeeper contains an array of Packet Timing Entry Fields for storing the timing information pertaining to multiple input data packets. It may be noted that each packet timing entry, associated to a data packet, may be indexed and thereby accessed from the associative array by using a Unique Identifier (Unique ID). The Template for the associative array of the Packet Timing Entry Fields is shown below in Table 1.

| Unique ID | Delay ID | Delay Mode | Packet Input Time | Input Packet Data Bytes Count | Expected Output Time | Output Packet Data Bytes Count | Tolerance | DUV Output Packet Seen | Actual Packet Delay | Delay Variance |
|---|---|---|---|---|---|---|---|---|---|---|

In one aspect, the Packet Timekeeper stores the Packet Timing Entry Fields pertaining to the input data packet, when the input data packet enters into the DUV/SUV. It may be noted that the Packet Timekeeper stores the Packet Timing Entry Fields by assigning the Unique ID to the data packet, when the testbench predicts an expected data packet corresponding to the input data packet that entered into the DUV/SUV. Further, the Packet Timekeeper generates timing information pertaining to the Packet Timing Entry Fields for the expected data packet and selected fields of the Packet Timing Entry Fields may be populated by the testbench. In one aspect, the descriptions of the Packet Timing Entry Fields are provided in Table 2, mentioned below.

| | |
|---|---|
| Unique ID | Unique ID for the expected data packet. It may be a string or an integer or any other data type. |
| Delay ID | Identifier for the respective (packet) data path in the DUV/SUV. It may be a string or an integer or any other data type. |
| Delay Mode | Indicative of delay value to be calculated. It is used in conjunction with a Delay ID. The Delay Mode needs to be the same for all the Packet Timing Entries that share a Delay ID. A Delay Mode value of '0' indicates that the expected output time for the data packet may be predicted by the Testbench and the Packet Timekeeper has to calculate the Delay Variance (Mode'0'). A Delay Mode value of '1' indicates that the expected output time for a packet cannot be predicted by the Testbench and the Packet Timekeeper has to calculate the Actual Packet Delay (Mode '1'). |
| Packet Input Time | The time of DUV/SUV Input corresponding to the data packet. |
| Input Packet Data Bytes Count | Number of data bytes present in the DUV Input (source packet) corresponding to the packet. |
| Expected Output Time | Predicted DUV/SUV Output Time for the data packet. |
| Output Packet Data Bytes Count | Number of data bytes expected in the data packet, when the data packet makes it to the DUV Output. |
| Tolerance | Tolerance for Expected Output Time vs. Actual Output Time. |
| DUV Output Packet Seen | A Flag may be assigned to the DUV/SUV Output Packet Seen, wherein the flag indicates that the data packet is made it to the DUV/SUV Output. |
| Actual Output Time | Actual DUV Output Time for the packet. |
| Actual Packet Delay | Used in Mode '0'. The Delay that the data packet has endured inside the DUV/SUV. In other words, the Actual Packet Delay is computed based on a difference between the Actual Output Time and the Packet Input Time. |
| Delay Variance | Used in Mode '1'. The Delay Variance is computed based on a difference between the Expected Output Time and Actual Output Time. |

Upon storing the timing information, the Packet Timekeeper may generate delay statistics using the timing information for the input data packet that is being processed by the DUV/SUV. In one aspect, the delay statistics may be used to analyse the delay behaviour of the DUV/SUV and thereby take corrective measures in order to optimize the performance of the DUV/SUV. While aspects of described system and method for providing an inference associated with the delays in processing the input data packet(s) may be implemented in any number of different computing systems, environments, and/or configurations, the embodiments are described in the context of the following exemplary system.

Figure 2:
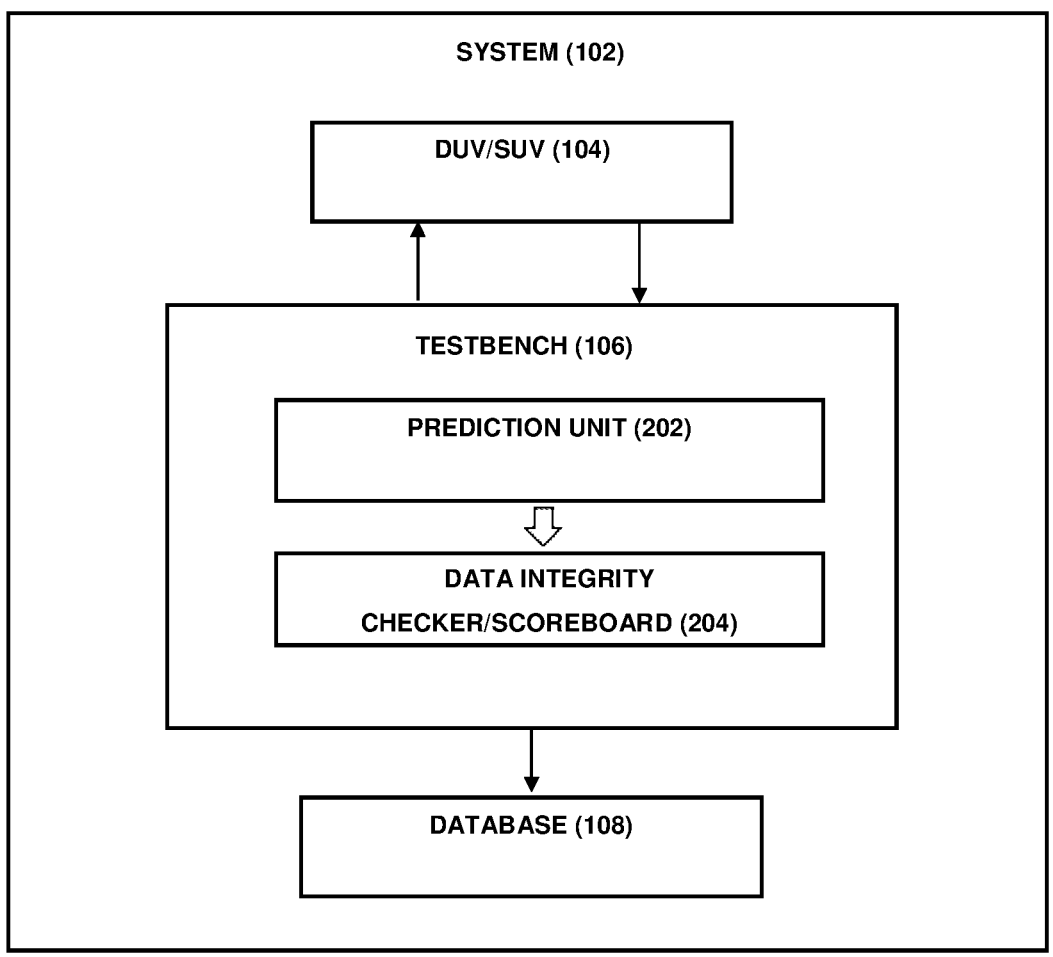
FIG. 2 illustrates the system, in accordance with an embodiment of the present subject matter.

Referring now to FIG. 2, an overview of a system 102 for providing an inference associated with delays in processing input data packet(s) by a Design Under Verification (DUV)/System Under Verification (SUV) 104 is illustrated. The DUV/SUV 104 may be configured to process a set of input data packets to generate a set of actual data packets. The system 102 includes a testbench 106 configured to communicate with the DUV/SUV 104. Further, the testbench 106 may be connected to a database 108. In one embodiment, the testbench 106 may be configured to predict an expected data packet corresponding to the input data packet and thereby assign a Unique Identifier (Unique ID) to the expected data packet corresponding to the input data packet that entered into the DUV/SUV for processing. After assigning the Unique ID, the testbench 106 populates the plurality of data fields pertaining to the Unique ID in an array of data type Packet Timing Entries. In one aspect, the plurality of data fields may be populated by determining a Delay Identifier (ID) and a Delay Mode for the expected data packet. The Delay ID may be determined based on at least one of a type of the expected data packet and a data path followed by the expected data packet within the DUV/SUV. The Delay Mode, on the other hand, may be determined based on the Delay ID, and wherein the Delay Mode is determined as at least one of 'Mode 0' and 'Mode 1'. After populating the Delay ID and Delay Mode, the testbench 106 populates a first set of data fields and a second of data fields. In one aspect, the first set of data fields may be populated based on the Delay ID. The second set of data fields may be populated based on the Delay Mode. After populating the first set of data fields and the second set of data fields, the testbench 106 compares the expected data packet with an actual data packet. In one aspect, the actual data packet indicates the input data packet after being processed by the DUV/SUV. If the expected data packet matches the actual data packet, the test bench 106 assigns a value of '1' to a DUV Output Packet Seen flag in the array of Packet Timing Entries corresponding to the Unique ID. In one aspect, the DUV Output Packet Seen flag's value '1' indicates that the actual data packet is out after being processed by the DUV/SUV. Subsequently, the testbench 106 populates a third set of data fields when the DUV Output Packet Seen flag's value is assigned with '1', a fourth set of data may be populated, when the DUV Output Packet Seen flag's value is assigned with '1' and the Delay Mode is determined as 'Mode 0', and a fifth set of data fields, when the DUV Output Packet Seen flag's value is assigned with '1' and the Delay Mode is determined as 'Mode 1'. The first set, the second set, the third set, the fourth set and the fifth set are subsets of the plurality data fields. Thus, in this manner, the inference associated to the delays in processing the input data packet(s) may be provided based on one or more subsets, of the plurality data fields, and the Delay Mode.

Figure 3:
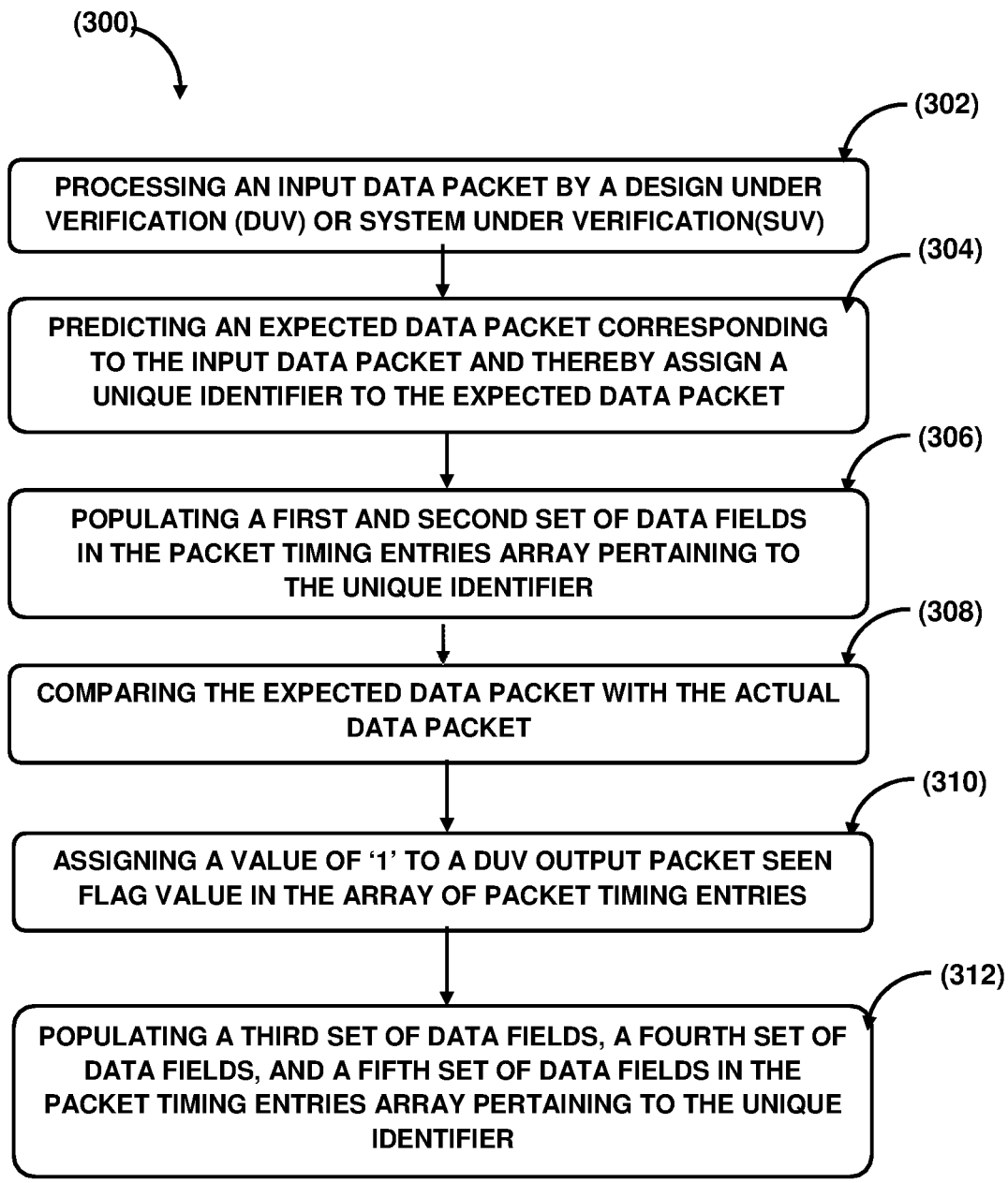
FIG. 3 illustrates a method for providing the inference associated with the delays in processing input data packet(s), in accordance with an embodiment of the present subject matter.

Referring now to FIG. 3, the system 102 is illustrated in accordance with an embodiment of the present subject matter. In one embodiment, the system 102 comprises the DUV/SUV 104 connected to the testbench 106. The DUV/SUV 104 may be configured to process an input data packet. Further, the testbench 106 may be connected to the database 108. The testbench 106 may include a prediction unit 202 and a Data Integrity Checker/Scoreboard 204.

For the input data packet entering the DUV/SUV 104, an entry in the array of data type Packet Timing Entries for an expected data packet corresponding to the input data packet is generated and selected fields of the entry in the array of data type Packet Timing Entries are populated by the prediction unit 202. In other words, once the expected data packet is predicted, the prediction unit 202 assigns a Unique Identifier (Unique ID) to the expected data packet corresponding to the input data packet that entered into the DUV/SUV 104 for processing. In one aspect, the Unique ID may be stored as an exclusive field (not present in the actual data packet and not used for data integrity checks) in the expected data packet and entries in the array of Packet Timing Entries. After assigning the Unique ID, the prediction unit 202 populates a plurality of data fields pertaining to the Unique ID in the array of Packet Timing Entries.

In one aspect, the array of Packet Timing Entries is populated by determining a Delay Identifier (ID) and a Delay Mode for the expected data packet. The Delay ID is determined based on at least one of a type of the expected data packet and a data path followed by the expected data packet within the DUV/SUV 104. It may be noted that Output Path/Interface of each DUV/SUV 104 may have its own Delay ID. For example, data packets that are intended to be dropped inside the DUV/SUV 104 may have their Delay ID as '0'. This may help in identifying the Packet Timing Entries corresponding to such input data packets, when needed.

The Delay Mode, on the other hand, may be determined based on the Delay ID. It may be noted that the Delay Mode may be determined as at least one of 'Mode 0' and 'Mode 1'. In one aspect, 'Mode 0' indicates that an Expected Output Time for the data packet is possible to predict. Mode '1', on the other hand, indicates the Expected Output Time for the data packet is impossible to predict.

Post determination of the Delay ID and the Delay Mode, the prediction unit 202 populates a first set of data fields and a second of data fields. The first set of data fields may be populated based on the Delay ID. The first set of data fields may comprise the Delay ID, a Packet Input Time, an Input Packet Data Bytes Count, and an Output Packet Data Bytes Count. The second set of data fields, on the other hand, may be populated based on the Delay Mode. The second set of data fields may comprise the Delay Mode, an Expected Output Time and a Tolerance.

It may be noted that the Delay Mode is used in conjunction with the Delay ID. The Delay Mode needs to be the same for all the data packets that share a Delay ID. For example, if a Packet Timing Entry uses a Delay Mode as 'Mode 0' and a Delay ID as '8', then all the Packet Timing Entries that have a Delay ID as '8', use the Delay Mode as 'Mode 0'. The prediction unit 202 selects a Delay Mode for a specific Delay ID and populates the corresponding Packet Timing Entry in the array of Packet Timing Entries for the expected data packets. In 'Mode 0', based on the expected delay that the input data packet endures inside the DUV/SUV 104, the Expected Output Time for the expected data packet is predicted and stored in the array of Packet Timing Entries by the prediction unit 202.

Subsequent to the population of the first set of data fields and the second set of data fields of the expected data packet, if the actual data packet makes it to the output of the DUV/SUV 104, the Data Integrity Checker/Scoreboard 204 compares the expected data packet with the actual data packet. If the expected data packet matches the actual data packet, the Data Integrity Checker/Scoreboard 204 locates the Packet Timing Entry in the array of Packet Timing Entries by using the Unique ID and thereby assigns a value of '1' to a DUV Output Packet Seen flag in the array of data type Packet Timing Entries corresponding to the Unique ID. It may be noted that the DUV Output Packet Seen flag's value '1' indicates that the actual data packet is out after being processed by the DUV/SUV 104.

Once the actual data packet is out after being processed by the DUV/SUV 104, the Data Integrity Checker/Scoreboard 204 populates a third set of data fields when the DUV Output Packet Seen flag's value is assigned with '1'. The third set of data fields may comprise an Actual Output Time. Upon determination of the first set of data fields, the second set of data fields, and the third set of data fields, the system 102 further runs through the array of Packet Timing Entries one after the other and thereby checks for the presence of the following condition.
1) Delay Mode is determined as 'Mode0'
2) Actual Output Time>(Expected Output Time+Tolerance)
3) DUV Output Packet Seen flag is assigned with a value of '0' . . . (1)

Whenever a Packet Timing Entry, present in the array of Packet Timing Entries, fulfils the aforementioned condition (1), the system 102 reports that the packet with the corresponding Unique ID has been overly-delayed by the DUV/SUV 104.

The system 102 further determines a fourth set of data fields, whenever a Packet Timing Entry, present in the array of Packet Timing Entries, fulfils the below condition(2).
1) Delay Mode is determined as 'Mode0'
2) DUV Output Packet Seen flag is assigned with a value of '1' . . . (2)

For the Packet Timing Entries that have the Delay Mode field set to '0' (Mode 0) and the DUV Output Packet Seen Flag is assigned with a value of '1', the system 102 determines the fourth set of data fields based on a difference between the Expected Output Time and the Actual Output Time. The fourth set of data fields may comprise a Delay Variance. It may be noted that the Delay Variance may be a negative value or a positive value.

The system 102 further determines a fifth set of data fields, whenever a Packet Timing Entry, present in the array of Packet Timing Entries, fulfils the below condition (3).
1) Delay Mode is determined as 'Mode1'
2) DUV Output Packet Seen flag is assigned with a value of '1' . . . (3)

For the Packet Timing Entries that have the Delay Mode field set to '1' (Mode 1) and the DUV Output Packet Seen flag is assigned with '1', the system 102 determines the fifth set of data fields based on a difference between the Actual Output Time and the Packet Input Time. The fifth set of data fields may comprise an Actual Packet Delay.

Thus, in this manner, the system 102 determines the plurality of data fields comprising the first set of data fields, the second set of data fields, the third set of data fields, the fourth set of data fields, and the fifth set of data fields and stores the timing information into the array of Packet Timing Entries. It may be noted that the first set of data fields, the second set of data fields, the third set of data fields, the fourth set of data fields, and the fifth set of data fields are the subsets of the plurality of data fields.

In one aspect, the system 102 may be configured to ignore Packet Timing Entries with specific Delay IDs so that there are no checks performed for certain packets that are intended to be dropped inside the DUV/SUV 104. Once the system 102 goes through the array of Packet Timing Entries, the system 102 waits for a specified period of time and repeats the process of going through the Packet Timing Entries one after the other in the array of Packet Timing Entries to perform the actions mentioned above until the system 102 have sufficient timing information in the array of Packet Timing Entries in order to generate a plurality of reports for DUV/SUV 104 delay behaviour analysis.

In one embodiment, the system 102 may generate a report indicating delay statistics based on at least one subset of the plurality of data fields. In one example, the system 102 may generate the report based on the fourth set of data fields and the fifth set of data fields i.e. the Delay Variance and the Actual Packet Delay. The report generated based on the Delay Variance may include a list of minimum Delay Variance, maximum Delay Variance, and average Delay Variance that share a Delay ID in 'Mode 0'. The system 102 may also generate the report indicating least Delay Variance and highest Delay Variance amongst the Delay Variances pertaining, to input data packets, present in the array of Packet Timing Entries.

In one example, the report generated based on the Delay Variance that share a Delay ID in 'Mode 0' is shown in below table.

| Delay ID | Minimum Delay Variance | Maximum Delay Variance | Average Delay Variance |
|---|---|---|---|
| 2 | 100 ns | 1 us | 0.75 us |
| 3 | 150 ns | 1.5 us | 0.6 us |
| 4 | 125 ns | 1.25 us | 0.8 us |
| 5 | 200 ns | 2 us | 1.5 us |

In another example, the report generated based on the Delay Variance that share a Delay ID in 'Mode 1' is shown in below table.

| Delay ID | Minimum Delay Variance | Maximum Delay Variance | Average Delay Variance |
|---|---|---|---|
| 2 | 0.5 ms | 2 ms | 1.5 ms |
| 3 | 0.7 ms | 2.5 ms | 2 ms |
| 4 | 0.6 ms | 1.5 ms | 1.2 ms |
| 5 | 0.2 ms | 3 ms | 2.6 ms |

In addition to the above, the system 102 may further generate a report including a list of minimum Actual Packet Delay, maximum Actual Packet Delay and average Actual Packet Delay that share a Delay ID value in 'Mode 1'. The system 102 may also generate the report indicating least Actual Packet Delay and highest Actual Packet Delay amongst the Actual Packet Delays pertaining, to data packets, present in the array of Packet Timing Entries.

In one embodiment, the delay statistics generated by the system 102 may help in determining operational behaviour of the DUV/SUV 104 with respect to delays associated to the input data packet. In one embodiment, for each Delay ID, the system 102 may compute an Output Rate (expressed in bits per second). In order to compute the Output Rate, the total number of output data bytes for a specific Delay ID maybe computed by adding the Output Packet Data Bytes Count in the array of Packet Timing Entries that have a common Delay ID. Out of the array of Packet Timing Entries, the system 102 determines a highest Actual Output Time and a lowest Actual Output Time. The difference between the highest Actual Output Time and the lowest Actual Output Time obtained from the array of Packet Timing Entries may provide a Total Output Time Lapsed. Upon determination of the Total Output Time Lapsed, the Output Rate for the specific Delay ID may then by computed using a formula (4) mentioned below.

$$\text{Output Rate for Delay ID 'X'}=(8*\text{Total Number of Output Bytes for Delay ID 'X'})/(\text{Total Output Time Lapsed for Delay ID 'X'}) \quad (4)$$

In one example, the report indicating the Output Rate, for a specific Delay ID, computed based on the formulation (4) is shown in below table.

| Delay ID | Output Rate |
|---|---|
| 1 | 108 Mbps |
| 6 | 75 Mbps |
| 7 | 153 Mbps |
| 8 | 197 Mbps |

Similarly, for each Delay ID, the system 102 may compute an Input Rate (expressed in bits per second). In order to compute the Input Rate, the total number of input data bytes for a specific Delay ID may be computed by adding the Input Packet Data Bytes Count in the array of Packet Timing Entries that share a Delay ID. Out of the array of Packet Timing Entries, the system 102 determines a highest Actual Input Time and a lowest Actual Input Time. The difference between the highest Actual Input Time and the lowest Actual Input Time obtained from the array of Packet Timing Entries may provide a Total Input Time Lapsed. Upon determination of the Total Input Time Lapsed, the Input Rate for the specific Delay ID may then by computed using a formula (5) mentioned below.

$$\text{Input Rate for Delay ID 'Y'}=(8*\text{Total Number of Input Bytes for Delay ID 'Y'})/(\text{Total Input Time Lapsed for Delay ID 'Y'}) \quad (5)$$

In one example, the report indicating the Input Rate, for a specific Delay ID, computed based on the formulation (5) is shown below table.

| Delay ID | Output Rate |
|---|---|
| 1 | 207 Mbps |
| 3 | 112 Mbps |
| 4 | 298 Mbps |
| 5 | 321 Mbps |

Based on the above formulations (4) and (5), the system 102 is able to determine the Input Rate and the Output Rate pertaining to a specific Delay ID that may help the user in understanding the delay behaviour of the DUV/SUV while processing the input data packet(s). Thus, in this manner, the system 102 may provide the inference associated to the operational behaviour of the DUV/SUV104.

Referring now to FIG. 3, a method 300 for providing an inference associated with delays in processing input data packet(s) by a Design Under Verification (DUV)/System Under Verification (SUV) is shown, in accordance with an embodiment of the present subject matter. The method 300 may be described in the general context of computer executable instructions. Generally, computer executable instructions can include routines, programs, objects, components, data structures, procedures, modules, functions, etc., that perform particular functions or implement particular abstract data types. The method 300 may also be practiced in a distributed computing environment where functions are performed by remote processing devices that are linked through a communications network. In a distributed computing environment, computer executable instructions may be located in both local and remote computer storage media, including memory storage devices.

The order in which the method 300 is described is not intended to be construed as a limitation, and any number of the described method blocks can be combined in any order to implement the method 300 or alternate methods. Additionally, individual blocks may be deleted from the method 300 without departing from the spirit and scope of the subject matter described herein. Furthermore, the method can be implemented in any suitable hardware, software, firmware, or combination thereof. However, for ease of explanation, in the embodiments described below, the method 300 may be considered to be implemented as described in the system 102.

At block 302, an input data packet may be processed by a Design Under Verification (DUV) or a System Under Verification (SUV) 104.

At block 304, an expected data packet may be predicted corresponding to the input data packet and thereby a Unique Identifier (Unique ID) is assigned to the expected data packet corresponding to the input data packet that entered into the DUV/SUV 104 for processing. In one implementation, the expected data packet may be predicted by the prediction unit 202.

At block 306, the plurality of data fields pertaining to the Unique ID may be populated in an array of Packet Timing Entries. In one aspect, the plurality of data fields may be populated by determining a Delay Identifier (Delay ID) and a Delay Mode for the expected data packet and populating a first set of data fields and a second of data fields based on the Delay ID and the Delay Mode respectively. In one implementation, the plurality of data fields may be populated by the prediction unit 202.

At block 308, the expected data packet may be compared with an actual data packet. In one aspect, the actual data packet indicates the input data packet after being processed by the DUV/SUV. In one implementation, the expected data packet may be compared with the actual data packet by the Data Integrity Checker/Scoreboard 204.

At block 310, a value of '1' may be assigned to a DUV Output Packet Seen flag in the array of Packet Timing Entries corresponding to the Unique ID, when the expected data packet matches the actual data packet. In one aspect, the DUV Output Packet Seen flag's value '1' indicates that the actual data packet is out after being processed by the DUV/SUV. In one implementation, the DUV Output Packet Seen flag's value may be assigned with '1' by the Data Integrity Checker/Scoreboard 204.

At block 312, a third set of data fields, a fourth set of data fields, and a fifth set of data fields may be populated. In one aspect, the third set of data fields may be populated when the DUV Output Packet Seen flag's value is assigned with '1'. The fourth set of data fields may be populated when the DUV Output Packet Seen flag's value is assigned with '1' and the Delay Mode is determined as 'Mode0'. The fifth set of data fields may be populated, when the DUV Output Packet Seen flag's value is assigned with '1' and the Delay Mode is determined as 'Mode 1'. In one implementation, the third set of data fields, the fourth set of data fields, and the fifth set of data fields may be populated by the Data Integrity Checker/Scoreboard 204.

Exemplary embodiments discussed above may provide certain advantages. Though not required to practice aspects of the disclosure, these advantages may include those provided by the following features.

Some embodiments enable a system and a method to process timing information for DUV Output Packets.

Some embodiments enable a system and a method to generate reports, indicating the Behaviour of a DUV/SUV (including minimum, maximum and average delay values for different DUV data paths and minimum, maximum and average delay variance values for different DUV data paths) while processing a data packet.

Some embodiments enable a system and a method to identify each packet that is overly-delayed inside the DUV and report the issue using a Standalone Module.

Although implementations for methods and systems for providing an inference associated with delays in processing input data packet(s) by a Design Under Verification (DUV)/System Under Verification (SUV) have been described in language specific to structural features and/or methods, it is to be understood that the appended claims are not necessarily limited to the specific features or methods described. Rather, the specific features and methods are disclosed as examples of implementations for providing the inference associated with the delays in processing the input data packet(s).

The invention claimed is:

1. A system for providing an inference associated with delays in processing an input data packet by a Design Under Verification (DUV)/System Under Verification (SUV) characterized by maintaining timing information of the input data packet, the system comprising:
   a DUV/SUV configured to process an input data packet;
   a testbench configured to communicate with the DUV/SUV, wherein the testbench includes:
      a prediction unit configured to:
         predict an expected data packet corresponding to the input data packet and thereby assign a Unique Identifier (Unique ID) to the expected data packet corresponding to the input data packet that entered into the DUV/SUV for processing;
         populate a plurality of data fields pertaining to the Unique Identifier in an array of Packet Timing Entries by:
            determining a Delay Identifier (Delay ID) and a Delay Mode for the expected data packet, wherein the Delay ID is determined based on at least one of a type of the expected data packet and a data path followed by the expected data packet within the DUV/SUV, and wherein the Delay Mode is determined based on the Delay ID, and wherein the Delay Mode is determined as at least one of 'Mode 0' and 'Mode 1'; and
            populating a first set of data fields and a second of data fields, wherein the first set of data fields is populated based on the Delay ID, and wherein the second set of data fields is populated based on the Delay Mode; and
      a Data Integrity Checker/Scoreboard configured to:
         compare the expected data packet with an actual data packet, wherein the actual data packet indicates the input data packet after being processed by the DUV/SUV;
         assign a value of '1' to a DUV Output Packet Seen flag in the array of Packet Timing Entries corresponding to the Unique ID, when the expected data packet matches the actual data packet, wherein the DUV Output Packet Seen flag's value '1' indicates that the actual data packet is out after being processed by the DUV/SUV; and
         populate a third set of data fields when the DUV Output Packet Seen flag's value is assigned with '1', a fourth set of data fields, when the DUV Output Packet Seen flag's value is assigned with '1' and the Delay Mode is determined as 'Mode 0', and a fifth set of data fields, when the DUV Output Packet Seen flag's value is assigned with '1' and the Delay Mode is determined as 'Mode 1', wherein the first set, the second set, the third set, the fourth set and the fifth set are subsets of the plurality data fields;
   thereby providing an inference associated to a delays in processing the input data packet(s) based on one or more subsets, of the plurality data fields, and the Delay Mode.

2. The system as claimed in claim 1, wherein the first set of data fields comprises the Delay ID, a Packet Input Time, an Input Packet Data Bytes Count, and an Output Packet Data Bytes Count, and wherein the second set of data fields comprises the Delay Mode, an Expected Output Time and a Tolerance, and wherein the third set of data fields comprises an Actual Output Time, and wherein the fourth set of data fields comprises a Delay Variance, and wherein the fifth set of data fields comprises an Actual Packet Delay.

3. The system as claimed in claim 1, wherein the 'Mode 0' indicates that an Expected Output Time for the data packet is possible to predict, and wherein the Mode '1' indicates the Expected Output Time for the data packet is impossible to predict.

4. The system as claimed in claim 2, wherein
   the fourth set of data fields based on the Expected Output Time and the Actual Output Time, when the Delay Mode is determined as 'Mode 0' and the DUV Output Packet Seen flag's value is assigned with '1'; and
   the fifth set of data fields based on the Actual Output Time and the Packet Input Time, when the Delay Mode is determined as 'Mode 1' and the DUV Output Packet Seen flag's value is assigned with '1'.

5. The system as claimed in claim 1, wherein the inference is provided as overly delayed, when:
   the Delay Mode is determined as 'Mode 0';
   the Actual Output Time is greater than summation of the Expected Output Time and the Tolerance; and
   the DUV Output Packet Seen flag's value is assigned with '0'.

6. The system as claimed in claim 1, wherein the inference is further provided as an operational behaviour of the DUV, and wherein the operational behaviour is determined upon computing either an Output rate for the Delay ID or an Input rate for a Delay ID.

7. The system as claimed in claim 6, wherein the Output rate for the Delay ID is computed based on a total number of Output Bytes for the corresponding Delay ID and a total output time lapsed for processing the corresponding Delay ID, and wherein the Input rate for the Delay ID is computed based on a total number of input Bytes for the corresponding Delay ID and a total input time lapsed for the corresponding Delay ID.

8. A method for providing an inference associated with delays in processing an input data packet by a Design Under Verification (DUV)/System Under Verification (SUV) characterized by maintaining timing information of the input data packet, the method comprising:
  processing an input data packet by a DUV or SUV;
  predicting, by a prediction unit, an expected data packet corresponding to the input data packet and thereby assign a Unique Identifier (Unique ID) to the expected data packet corresponding to the input data packet that entered into the DUV/SUV for processing;
  populating, by the prediction unit, the plurality of data fields pertaining to the Unique ID in an array of Packet Timing Entries by:
    determining a Delay Identifier (Delay ID) and a Delay Mode for the expected data packet, wherein the Delay ID is determined based on at least one of a type of the expected data packet and a data path followed by the expected data packet within the DUV/SUV, and wherein the Delay Mode is determined based on the Delay ID,
    and wherein the Delay Mode is determined as at least one of 'Mode 0' and 'Mode 1'; and
    populating a first set of data fields and a second of data fields, wherein the first set of data fields is populated based on the Delay ID, and wherein the second set of data fields is populated based on the Delay Mode;
  comparing, by a Data Integrity Checker/Scoreboard, the expected data packet with an actual data packet, wherein the actual data packet indicates the input data packet after being processed by the DUV/SUV;
  assigning, by the Data Integrity Checker/Scoreboard, a value of '1' to a DUV Output Packet Seen flag in the array of Packet Timing Entries corresponding to the Unique ID, when the expected data packet matches the actual data packet, wherein the DUV Output Packet Seen flag's value '1' indicates that the actual data packet is out after being processed by the DUV/SUV; and
  populating, by the Data Integrity Checker/Scoreboard, a third set of data fields when the DUV Output Packet Seen flag's value is assigned with '1', a fourth set of data fields, when the DUV Output Packet Seen flag's value is assigned with '1' and the Delay Mode is determined as 'Mode 0', and a fifth set of data fields, when the DUV Output Packet Seen flag's value is assigned with '1' and the Delay Mode is determined as 'Mode 1', wherein the first set, the second set, the third set, the fourth set and the fifth set are subsets of the plurality data fields,
  thereby providing an inference associated to delays in processing the input data packet(s) based on one or more subsets, of the plurality data fields, and the Delay Mode.

9. The method as claimed in claim 8, wherein the first set of data fields comprises the Delay ID, a Packet Input Time, an Input Packet Data Bytes Count, and an Output Packet Data Bytes Count, and wherein the second set of data fields comprises the Delay Mode, an Expected Output Time and a Tolerance, and wherein the third set of data fields comprises an Actual Output Time, and wherein the fourth set of data fields comprises a Delay Variance, and wherein the fifth set of data fields comprises an Actual Packet Delay.

10. The method as claimed in claim 8, wherein the 'Mode 0' indicates that an Expected Output Time for the data packet is possible to predict, and wherein the Mode '1' indicates the Expected Output Time for the data packet is impossible to predict.

11. The method as claimed in claim 9 further, wherein the fourth set of data fields based on the Expected Output Time and the Actual Output Time, when the Delay Mode is determined as 'Mode 0' and the DUV Output Packet Seen flag's value is assigned with '1'; and
  the fifth set of data fields based on the Actual Output Time and the Packet Input Time, when the Delay Mode is determined as 'Mode 1' and the DUV Output Packet Seen flag's value is assigned with '1'.

12. The method as claimed in claim 8, wherein the inference is either as overly delayed, when:
  the Delay Mode is determined as 'Mode 0';
  the Actual Output Time is greater than summation of the Expected Output Time and the Tolerance; and
  the DUV Output Packet Seen flag's value is assigned with '0'.

13. The method as claimed in claim 8, wherein the inference is further provided as an operational behaviour of the DUV, and wherein the operational behaviour is determined upon computing either an Output rate for the Delay ID or an Input rate for a Delay ID.

14. The method as claimed in claim 13, wherein the Output rate for the Delay ID is computed based on a total number of Output Bytes for the corresponding Delay ID and a total output time lapsed for processing the corresponding Delay ID, and wherein the Input rate for the Delay ID is computed based on a total number of input Bytes for the corresponding Delay ID and a total input time lapsed for the corresponding Delay ID.

15. A non-transitory computer readable medium embodying a program executable in a computing device for providing an inference associated with delays in processing input data packet(s) by a Design Under Verification (DUV)/System Under Verification (SUV) characterized by maintaining timing information of the input data packet, the program comprising:
  a program code for processing a input data packet by a DUV or SUV;
  a program code for predicting an expected data packet corresponding to the input data packet and thereby assign a Unique Identifier (Unique ID) to the expected data packet entered into the DUV/SUV for processing;
  a program code for populating the plurality of data fields pertaining to the Unique ID in an array of Packet Timing Entries by:
    determining a Delay Identifier (Delay ID) and a Delay Mode for the expected data packet, wherein the Delay ID is determined based on at least one of a type of the expected data packet and a data path followed by the expected data packet within the DUV/SUV, and wherein the Delay Mode is determined based on the Delay ID, and wherein the Delay Mode is determined as at least one of 'Mode 0' and 'Mode 1'; and
    populating a first set of data fields and a second of data fields, wherein the first set of data fields is populated based on the Delay ID, and wherein the second set of data fields is populated based on the Delay Mode;
  a program code for comparing the expected data packet with an actual data packet, wherein the actual data packet indicates the input data packet after being processed by the DUV/SUV;
  a program code for assigning a value of '1' to a DUV Output Packet Seen flag in the array of Packet Timing Entries corresponding to the Unique ID, when the expected data packet matches the actual data packet, wherein the DUV Output Packet Seen flag's value '1' indicates that the actual data packet is out after being processed by the DUV/SUV; and a program code for populating a third set of data fields when the DUV Output Packet Seen flag's value is assigned with '1', a fourth set of data fields, when the DUV Output Packet Seen flag's value is assigned with '1' and the Delay Mode is determined as 'Mode 0', and a fifth set of data fields, when the DUV Output Packet Seen flag's value is assigned with '1' and the Delay Mode is determined as 'Mode 1', wherein the first set, the second set, the third set, the fourth set and the fifth set are subsets of the plurality data fields, thereby providing an inference associated to delays in processing the input data packet(s) based on one or more subsets, of the plurality data fields, and the Delay Mode.

\* \* \* \* \*